United States Patent [19]
Bristol

[11] Patent Number: 4,553,091
[45] Date of Patent: Nov. 12, 1985

[54] AUTOMATIC VERTICAL CALIBRATION METHOD AND SYSTEM FOR AN OSCILLOSCOPE

[75] Inventor: L. Rodney Bristol, Tigard, Oreg.
[73] Assignee: Tektronix, Inc., Beaverton, Oreg.
[21] Appl. No.: 464,285
[22] Filed: Feb. 7, 1983
[51] Int. Cl.[4] ............... G01R 35/00; G01R 13/30
[52] U.S. Cl. ............................. 324/74; 324/115; 324/121 R; 324/130; 364/571
[58] Field of Search ............... 324/74, 121 R, 115, 324/130; 364/571; 315/377

[56] References Cited
U.S. PATENT DOCUMENTS

| | | | |
|---|---|---|---|
| 4,162,531 | 7/1979 | Rode et al. | 364/571 |
| 4,200,933 | 4/1980 | Nickel et al. | 324/74 X |
| 4,364,027 | 12/1982 | Murooka | 324/121 R X |

OTHER PUBLICATIONS
Electronics, Austgen, P. et al., "Software-Based Design Automates Scope Operations", vol. 54, No. 5, Mar. 10, 1981; pp. 181-188.
Electronics, Garuts, V. et al., "On-Board Digital Processing Refines Scope Measurements", vol. 53, No. 6, Mar. 13, 1980; pp. 105-114.

Primary Examiner—Stewart J. Levy
Assistant Examiner—Stephen M. Baker
Attorney, Agent, or Firm—George T. Noe

[57] ABSTRACT

An oscilloscope vertical calibration system is provided in which gain control elements in one or more vertical input channels are automatically controlled with respect to cursor voltages applied to the vertical output amplifier. Such calibration process is performed for each deflection factor setting either manually or automatically and the correct gain control signals are stored in memory.

13 Claims, 2 Drawing Figures

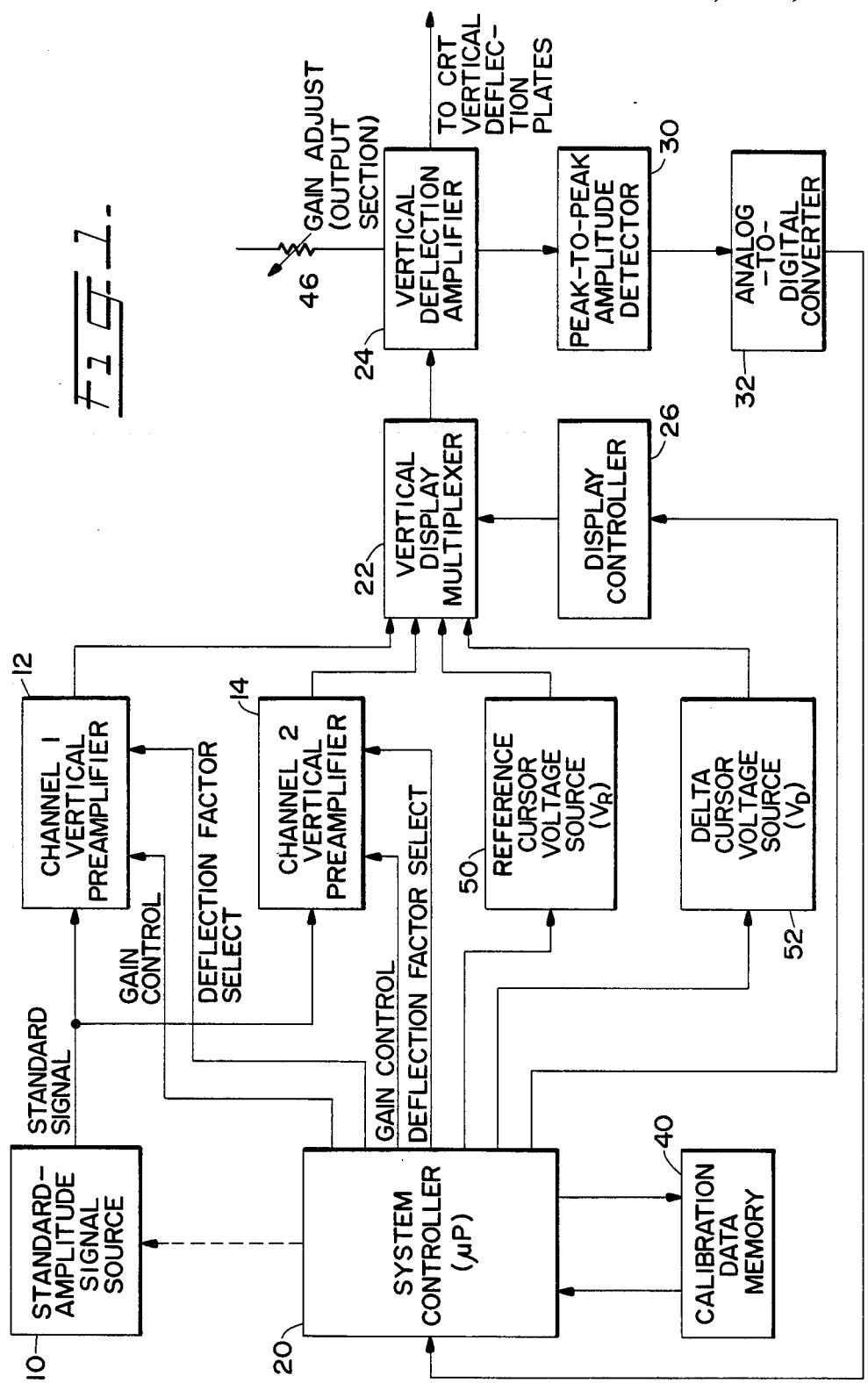

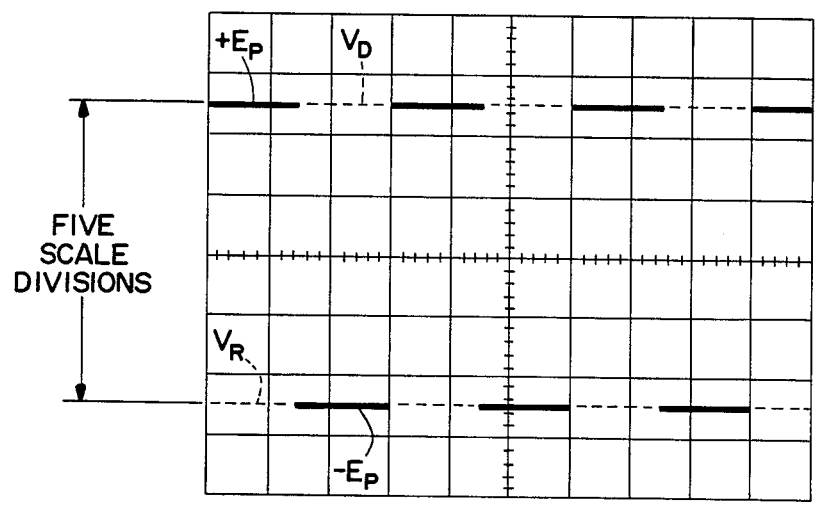

AUTOMATIC VERTICAL CALIBRATION METHOD AND SYSTEM FOR AN OSCILLOSCOPE

BACKGROUND OF THE INVENTION

The present invention relates generally to the vertical deflection system of an oscilloscope, and more particularly to a method and system for automatically calibrating the vertical system.

It is well established that oscilloscopes are electrical measurement tools which graphically display electrical events upon a viewing screen wherein the vertical axis thereof represents the magnitude or amplitude scale of the electrical events while the horizontal axis thereof represents the time scale. Typically, the oscilloscope viewing screen has superimposed thereon a grid of precisely spaced vertical and horizontal lines, such grid being known in the art as a graticule, to permit an operator to measure the electrical event, or input signal, with some degree of accuracy. Of course, to ensure this accuracy, the vertical and horizontal deflection systems must be calibrated in order to scale any electrical input signal to the graticule grid divisions.

The vertical deflection system may typically include two or more vertical input channels which are selectively connected to a vertical deflection amplifier to be applied to the vertical deflection plates of a cathode-ray tube (CRT). Each vertical channel typically includes a wide range of selectable gain factors to accomodate a variety of signal amplitudes, and these gain factors, known in the art as vertical deflection factors, may be provided in steps in a 1-2-5 sequence. Calibrating the vertical deflection system in the past has involved a technician manually adjusting variable circuit elements while viewing the display to provide the correct deflection of an externally-applied standard reference signal of known amplitude. This is typically time consuming because the calibration procedure must be carried out for each vertical input channel and for each deflection factor, and is accurate only to the degree of accuracy of the reference input signal and the visual perception of the technician. To cut down on the number of adjustments required, matched attenuators and appropriately scaled amplifier gain-setting elements have been used for a certain number of deflection factors. To facilitate the accuracy of amplitude measurement, delta voltage cursors have been added wherein the difference between a first and second adjustable amplitude marker may be read out alphanumerically. However, the calibrating technician must manually adjust the relative vertical deflection of the cursors to match the normalized (calibrated to a nominal standard reference) deflection factors.

SUMMARY OF THE INVENTION

In accordance with the present invention, an automatic vertical calibration method and system for an oscilloscope is provided. A standard signal of known amplitude is applied to one vertical input channel and processed through the selectable attenuator and controllable gain stages of the vertical preamplifier. Initially, a system controller, such as a microprocessor, selects attenuator and gain settings which will provide a predetermined nominal deflection factor, thereby establishing a normalized gain. The peak-to-peak amplitude of the vertical preamplifier is measured and stored as reference data in a memory to be used as a reference by the system controller in automatically calibrating each deflection factor for each vertical channel by use of a gain-matching process. Basically, the system controller monitors the preamplifier output (or vertical deflection amplifier input) for each selected deflection factor and corresponding standard-amplitude signals, and generates a gain control voltage to match the preamplifier peak-to-peak output measurement with the stored reference. The controller may automatically select standard signal amplitudes and vertical deflection factors as well so that no human activity is required during the automatic gain-matching process. Final adjustment to provide precise alignment of the standard signal upper and lower peaks with the display graticule lines may be made by a single gain adjustment of the output amplifier.

Additionally, in the automatic calibration system of the present invention, voltage measurement cursors may be matched automatically to the normalized deflection factors by developing and storing calibration data representing the scale factor of the cursor voltage generators as required to produce the same voltage difference between two cursors as a corresponding peak-to-peak amplitude from the standard signal source through a vertical input channel.

It is therefore one object of the present invention to provide an automatic vertical calibration method and system for an oscilloscope.

It is another object of the present invention to provide a system which automatically normalizes by a gain-matching process all of the deflection factors for any number of vertical input channels of an oscilloscope.

It is a futher object of the present invention to match delta voltage cursors to automatically normalized vertical input channels of an oscilloscope, thereby to provide automatically calibrated voltage measurement cursors.

It is a feature of the present invention to provide an automatic calibration method and system for the vertical deflection system of an oscilloscope which results in improved calibration accuracy, eliminates manual adjustments, and relaxes circuit matching requirements.

Other objects, features, and advantages of the present invention will become apparent to those having ordinary skill in the art upon a reading of the following description when taken in conjunction with the accompanying drawings.

BRIEF DESCRIPTION OF THE DRAWINGS

FIG. 1 is a block diagram of a preferred embodiment of a calibration system in accordance with the present invention; and FIG. 2 shows a typical oscilloscope viewing screen with a square-wave signal displayed thereon.

DETAILED DESCRIPTION OF THE INVENTION

Referring now to FIG. 1 of the drawings, there is shown a block diagram of a preferred embodiment of the present invention in which a standard-amplitude signal from a standard-amplitude signal source 10 is applied simultaneously to the Channel 1 vertical preamplifier 12 and Channel 2 vertical preamplifer 14 of a dual-input-channel oscilloscope. It must be mentioned at the outset that two input channels are described for purposes of illustration, and that in actuality the method and system of the present invention may be used for any number of channels. The vertical preamplifiers 12 and 14 are largely conventional and include a plurality of electronically-selectable attenuator and controllable-gain amplifier stages to provide a plurality of vertical deflection factors. The standard-amplitude signal source suitably may produce a selection of standard amplitudes to be applied to the vertical preamplifiers 12 and 14 in accordance with the selected deflection factors. Preferably, the standard amplitudes are a constant multiple of the selected deflection factors so that preamplifier outputs (and displayed signal amplitudes) are identical for each selected deflection factor.

A system controller 20, which may suitably be a microprocessor (μP) and associated elements including a digital-to-analog converter, a program memory, and a temporary memory (random-access memory), provides gain control analog voltages and deflection factor select signals for the vertical preamplifiers 12 and 14. A dashed line is connected between the system controller 20 and signal source 10 to indicate that in a completely automated system the reference signal amplitudes may be selected in accordance with the selected deflection factors.

A vertical display multiplexer 22 selects one output of the Channel 1 and Channel 2 vertical preamplifiers 12 and 14 for passage to a vertical deflection amplifier 24 for final amplification before being applied to the vertical deflection plates of the CRT. The multiplexer 22 operates in a mode selected by a display controller 26, which in turn receives control signals from the system controller 20.

Operation of the automatic vertical calibration system and discussion of the remaining blocks is as follows: The system controller 20 initializes a calibration procedure in response to a front-panel switch, such as a calibration sequence switch, or an external keyboard by providing a deflection factor select signal to the Channel 1 vertical preamplifier 12. The standard-amplitude signal source 10 may be adjusted either by a front-panel signal-amplitude select switch or automatically by the system controller 20 to provide a standard signal of predetermined amplitude. For this example, assume that the Channel 1 vertical preamplifier 12 is set to a deflection factor of 100 millivolts per graticule-scale division, and standard-amplitude signal source is set to provide a standard-amplitude signal which is 500 millivolts peak to peak amplitude. The gain control of vertical preamplifier 12 may be set to midrange by the controller. The display controller 26 sets vertical display multiplexer 22 to pass the Channel 1 signal to the vertical deflection amplifier 24. The peak-to-peak amplitude of the preamplified standard-amplitude signal is measured by a peak-to-peak amplitude detector 30 at a convenient access point such as the input stage of vertical deflection amplifier 24. The detected peaks, which are represented by $+E_p$ and $-E_p$ in FIG. 2 provide a peak-to-peak amplitude difference which is converted by analog-to-digital converter 32 to a digital reference code which is stored by system controller 20 in a temporary memory. Amplitude detector 30 and analog-to-digital converter 32 may suitably comprise a voltage comparator, a comparison reference voltage source controlled by the system controller 20, and a sequence of states of the controller 20 that searches for peaks of the preamplified reference signal by varying the comparison reference voltage and monitoring the output state of the voltage comparator. It is important to note at this point that while a five-division amplitude signal is expected on-screen, this is a nominal value and may actually be more or less than five divisions, for example, somewhere between 4.5 and 5.5 divisions. As long as the deflection factors of the Channel 1 and Channel 2 vertical preamplifiers are normalized to each other, i.e., the detached peak-to-peak amplitude is the same for all deflection factors, the final adjustment to five divisions for all deflection factors may be provided by adjusting potentiometer 46 in the vertical deflection amplifier 24 output stage.

After completion of the initializing step and storage of the peak-to-peak standard-amplitude signal in the temporary memory, the system controller selects the next deflection factor, and the appropriate standard signal amplitude of signal source 10 is selected as well. The new preamplified standard signal at the input of vertical deflection amplifier 24 is measured by peak-to-peak amplitude detector 30, converted to digital data by analog-to-digital converter (ADC)32, and compared by system controller 20 with the reference data stored in the temporary memory. The difference between these values results in a gain control signal developed by an internal digital-to-analog converter of system controller 20 and is iteratively applied to the variable-gain stage of preamplifier 12 to match the measured preamplified standard peak-to-peak amplitude as provided by ADC 32 to match the stored reference value. Thus, the second selected deflection factor is normalized to the first one which was stored in a memory 40 as a reference. A third deflection factor and appropriate standard signal amplitude are selected, and the process is repeated to normalize the third deflection factor with the first two. In sequence, new deflection factors and reference signal amplitudes are selected, and display controller 26 operates to select the appropriate preamplifier 12 and 14 outputs until all deflection factors for both channels are normalized to each other. Data corresponding to the gain control signals for each deflection factor are stored in calibration data memory 40.

The stored calibration data in memory 40 may also be used to establish the scale factor of a pair of voltage measurement cursors $V_R$, indicating a reference voltage cursor generated by a reference cursor voltage source 50, and $V_D$, indicating a delta or difference voltage cursor generated by a delta cursor voltage source 52. The cursor voltages $V_R$ and $V_D$ appear at the relative vertical positions indicated in FIG. 2. The cursors $V_R$ and $V_D$ are set near the positions at which the preamplified standard peaks $-E_P$ and $-E_P$ occur, and the voltage difference developed by cursors $V_R$ and $V_D$ is measured by peak-to-peak amplitude detector 30 and converted to digital data by ADC 32 to be compared by system controller 20 with the calibration standard data stored in memory 40. System controller 20 then iteratively applies new control data to cursor voltage generators 50 and 52 until the difference between cursors matched the stored measurement of the initial preamplified reference signal. The cursor control data thus generated is then stored at predetermined memory locations in memory 40 to be used as cursor scale factor data during subsequent operation. Thus, the measurement of the waveform on the CRT graticule scale using the cursors $V_R$ and $V_D$ is accurate at all deflection factor settings. Consequently, the gain of the vertical deflection amplifier 24 may be adjusted by potentiometer 46, or other suitable means, so that the presentation of waveforms and cursors on the CRT display screen represents the specific voltage per division identified by each and every deflection factor setting.

As an alternative calibration sequence, the initially measured peak-to-peak standard amplitude value to be stored in temporary memory may be derived from the difference between two predetermined cursor voltages $V_R$ and $V_D$ corresponding to a nominal cursor separation or deflection on the CRT display screen (e.g., 5 divisions nominal). Subsequently, system controller 20 may develop a gain control signal and store corresponding gain control data to select a standard-amplitude signal produced by signal source 10 and corresponding deflection factor of Channel 1 and Channel 2 vertical preamplifiers 12 and 14 as required to produce a peak-to-peak signal voltage measurement which is equal (or nearly equal) to the stored reference data.

The gain control data required to generate the correct gain control signal for each deflection factor is stored in specific location in calibration data memory 40 for each deflection factor setting for each input channel preamplifier for subsequent use in oscilloscope operation.

The calibration method and system herein described in particularly suited for a multiple-channel oscilloscope to quickly and automatically calibrate the deflection factors of all channels, to improve calibration accuracy of each channel, to eliminate manual adjustments and operator error, and to relax circuit matching requirements. Moreover, the vertical deflection system thus calibrated will provide accurate waveform amplitude measurement either from observation of the CRT screen or by comparison with superimposed voltage cursors.

While I have shown and described a preferred embodiment of my invention, it will become apparent to those skilled in the art that many changes and modifications may be made without departing from my invention in its broader aspects. For example, the standard amplitude signal may simply be a DC voltage if the DC level of the vertical amplifier is established under a no-input-signal condition. In such a case, only one voltage cursor is required for the calibration procedure. Additionally, since the voltage comparator in the peak-to-peak amplitude detector changes its output state when the peak voltage of the input signal exceeds a reference level, the comparator output may be used to trigger the sweep circuit of the oscilloscope during normal oscilloscope operation. It is therefore contemplated that the appended claims will cover all such changes and modifications as fall within the true scope of the invention.

What I claim as being novel is:

1. A method of calibrating the vertical deflection system of an oscilloscope, comprising the steps of:
   (a) applying a standard amplitude signal to the input preamplifier of said oscilloscope;
   (b) measuring the amplitude of the standard signal after preamplification thereof at a preselected deflection factor setting of said preamplifier by detecting the peak-to-peak voltage of said preamplifier standard signal;
   (c) converting said detected peak-to-peak voltage to reference data corresponding to said measured amplitude and storing said reference data;
   (d) selecting by automatic means a new predetermined amplitude of said standard signal and a new predetermined deflection factor of said preamplifier;
   (e) measuring the amplitude of the standard signal after preamplification at the new settings and producing new reference data corresponding to the new measured amplitude value;
   (f) comparing the new reference data with the stored reference data and developing therefrom a gain control signal; and
   (g) applying the gain control signal to said preamplifier to control the gain thereof.

2. A method in accordance with claim 1 further comprising the steps of:
   generating a pair of cursor voltages;
   measuring the difference between said pair of cursor voltages;
   comparing the measured difference value with the stored reference data; and
   generating cursor control data to change the cursor voltages so that the measured difference therebetween matches said reference data.

3. A method in accordance with claim 1 further comprising the step of storing digital codes corresponding to said gain control signals for subsequent use in deflection factor selection.

4. A system for calibrating the vertical deflection system of an oscilloscope, comprising:
   means for applying a standard-amplitude signal to the input preamplifier of said oscilloscope, said preamplifier having a plurality of selectable deflection factor settings and a controllable gain stage;
   means for measuring the amplitude of said standard signal after preamplification thereof at a first preselected deflection factor setting by detecting the peak-to-peak voltage of said preamplified standard signal;
   means for converting said detected peak-to-peak voltage to reference data corresponding to said measured amplitude and storing said reference data;
   means for automatically selecting a new deflection factor setting and a new predetermined amplitude of said standard signal, said measuring means measuring the new preamplified amplitude of the standard signal to provide new reference data corresponding to said new measured amplitude value;
   means for comparing the new reference data with the stored reference data and developing a gain control signal therefrom; and
   means for applying said gain control signal to said preamplifier to control the gain thereof.

5. A system in accordance with claim 4 wherein digital data corresponding to said gain control signal is stored for subsequent use in deflection factor selection.

6. A system in accordance with claim 4 further comprising:
   means for generating cursor voltages, said measuring means measuring the difference in magnitude between said cursor voltages; and
   means for comparing the measured difference values with said stored reference data and generating cursor control signals to change the cursor voltages so that the measured difference is normalized to the stored standard reference data.

7. An oscilloscope vertical calibration system, comprising:
   a vertical input amplifier including a gain control element and for amplifying a standard amplitude signal;
   first and second cursor generators to provide respective cursor voltages of a predetermined voltage difference therebetween;

a vertical output amplifier for selectively amplifying the output from said vertical input amplifier and said cursor generators;

comparison means for comparing the outputs of said standard amplitude signal and cursor voltages from said vertical output amplifier; and control means for controlling the gain control element in such a manner that said standard amplitude and cursor voltages are equal to each other.

8. An oscilloscope vertical calibration system in accordance with claim 7 wherein said comparison means compares the peak-to-peak voltage of the standard amplitude signal and the difference voltage of said cursor voltages.

9. An oscilloscope vertical calibration system in accordance with claim 7 wherein said vertical input amplifier includes a plurality of switchable attenuators and calibration is performed at each setting of said switchable attenuators by controlling said cursor voltages.

10. An oscilloscope vertical calibration system in accordance with claim 9 wherein said switchable attenuators and cursor generators are controlled by said control means.

11. An oscilloscope vertical calibration system in accordance with claim 10, further including memory means to store the final gain control voltage for each attenuator setting.

12. An oscilloscope vertical calibration system in accordance with claim 9 wherein the output amplitude of said standard amplitude signal is switched in response to the attenuation ratio of the selected attenuator.

13. An oscilloscope vertical calibration system in accordance with claim 7 wherein more than one vertical input amplifier is included.

* * * * *